US012494377B2

(12) United States Patent
Yu et al.

(10) Patent No.: US 12,494,377 B2
(45) Date of Patent: Dec. 9, 2025

(54) MULTI-SURFACE AIRTIGHT PACKAGING CERAMIC SHELL, MULTI-SURFACE PACKAGING DEVICE AND PREPARATION METHOD

(71) Applicant: The 13th Research Institute of China Electronics Technology Group Corporation, Shijiazhuang (CN)

(72) Inventors: Fei Yu, Shijiazhuang (CN); Zhentao Yang, Shijiazhuang (CN); Ximeng Yu, Shijiazhuang (CN); Jiangtao Chen, Shijiazhuang (CN); Linjie Liu, Shijiazhuang (CN)

(73) Assignee: The 13th Research Institute of China Electronics Technology Group Corporation, Shijiazhuang (CN)

(*) Notice: Subject to any disclaimer, the term of this patent is extended or adjusted under 35 U.S.C. 154(b) by 0 days.

(21) Appl. No.: 19/191,918

(22) Filed: Apr. 28, 2025

(65) Prior Publication Data
US 2025/0316497 A1 Oct. 9, 2025

Related U.S. Application Data

(63) Continuation of application No. PCT/CN2024/106310, filed on Jul. 19, 2024.

(30) Foreign Application Priority Data

Apr. 7, 2024 (CN) .......................... 202410407599.4

(51) Int. Cl.
*H01L 21/48* (2006.01)
*C04B 37/02* (2006.01)

(52) U.S. Cl.
CPC ........ *H01L 21/4807* (2013.01); *C04B 37/023* (2013.01); *C04B 2237/125* (2013.01);
(Continued)

(58) Field of Classification Search
CPC .............. H01L 21/4807; C04B 37/023; C04B 2237/125; C04B 2237/341; C04B 2237/405; C04B 2237/62
See application file for complete search history.

(56) References Cited

U.S. PATENT DOCUMENTS 4,113,896 A * 9/1978 Keiner ................ C04B 35/6269
427/125
4,664,942 A * 5/1987 Park ....................... H05K 3/246
427/253

(Continued)

FOREIGN PATENT DOCUMENTS

CN          115642130 A         1/2023
CN          115799181 A         3/2023
(Continued)

OTHER PUBLICATIONS

Translation of CN-118538677-A (Year: 2024).*
Translation of CN-118919495-A (Year: 2024).*

Primary Examiner — Jeffrey T Carley
(74) Attorney, Agent, or Firm — AP3 Law Firm PLLC

(57) ABSTRACT

The present application provides a multi-surface airtight packaging ceramic shell, a multi-surface packaging device, and preparation method, belonging to the field of ceramic packaging technology. The multi-surface airtight packaging ceramic shell includes: a ceramic body, a shape of which is a polyhedron; where at least one surface of the ceramic body is provided with a shared solder pad, remaining surfaces other than the at least one surface having the shared solder pad are provided with sealing rings, and a packaging cavity for packaging a chip is formed inside each sealing ring. The ceramic body provided in the present application is a polyhedron, with one surface of shared solder pad as the bottom (Continued)

surface, and the other surfaces having chip mounting areas, bonding areas, and sealing rings.

9 Claims, 7 Drawing Sheets

(52) U.S. Cl.
CPC .. *C04B 2237/341* (2013.01); *C04B 2237/405* (2013.01); *C04B 2237/62* (2013.01)

(56) References Cited

U.S. PATENT DOCUMENTS

| | | | | |
|---|---|---|---|---|
| 4,866,571 | A | * | 9/1989 | Butt ..................... H05K 1/053 |
| | | | | 174/16.3 |
| 6,545,227 | B2 | * | 4/2003 | Silverman ............... H01L 24/32 |
| | | | | 257/784 |
| D769,834 | S | * | 10/2016 | Kawase ..................... D13/182 |
| 12,027,545 | B2 | * | 7/2024 | Hsu .................... H01L 23/3157 |
| 2022/0044981 | A1 | * | 2/2022 | Murdock ............. H01L 23/047 |

FOREIGN PATENT DOCUMENTS

| | | | | | |
|---|---|---|---|---|---|
| CN | 117712084 | A | | 3/2024 | |
| CN | 117720061 | A | | 3/2024 | |
| CN | 118538677 | A | * | 8/2024 | ......... H01L 21/4817 |
| CN | 118919495 | A | * | 11/2024 | ........... H01Q 1/2283 |

* cited by examiner

MULTI-SURFACE AIRTIGHT PACKAGING CERAMIC SHELL, MULTI-SURFACE PACKAGING DEVICE AND PREPARATION METHOD

CROSS-REFERENCE TO RELATED APPLICATIONS

This application is a continuation application of International Application No. PCT/CN2024/106310, filed on Jul. 19, 2024 and entitled "multi-surface airtight packaging ceramic shell, multi-surface packaging device and preparation method," which claims priority to Chinese Patent Application No. CN 202410407599.4, filed on Apr. 7, 2024 and entitled "multi-surface airtight packaging ceramic shell, multi-surface packaging device and preparation method." The disclosures of the aforementioned applications are hereby incorporated herein by reference in their entireties.

TECHNICAL FIELD

The present application belongs to the technical field of ceramic packaging, and particularly relates to a multi-surface airtight packaging ceramic shell, a multi-surface packaging device and a preparation method for a multi-surface airtight packaging ceramic shell.

BACKGROUND

The current ceramic packaging shell only has the function of encapsulating chips on the front and back surfaces, which cannot meet the requirements of semiconductor device integration and miniaturization.

SUMMARY

These and other problems are generally solved or circumvented, and technical advantages are generally achieved, by embodiments of the present application which provide a multi-surface airtight packaging ceramic shell, a multi-surface packaging device and a preparation method for a multi-surface airtight packaging ceramic shell.

Technical Problems

The present application provides a multi-surface airtight packaging ceramic shell, a multi-surface packaging device and a preparation method for a multi-surface airtight packaging ceramic shell, aiming to achieve multifunctional high integration of semiconductor devices, miniaturization and lightweight of devices, and maximize performance while reducing device size, in order to solve the problem that current ceramic packaging shells cannot meet the requirements of semiconductor device integration and miniaturization.

Technical Solutions

To achieve the above objectives, the technical solution adopted in the present application is:

In a first aspect, embodiments of the present application provide a multi-surface airtight packaging ceramic shell including a ceramic body, a shape of which is a polyhedron; where at least one surface of the ceramic body is provided with a shared solder pad, remaining surfaces other than the at least one surface having the shared solder pad are provided with sealing rings, and a packaging cavity for packaging a chip is formed inside each sealing ring.

Combining the first aspect, in one possible implementation, within each sealing ring is provided with one or more ceramic strips for bonding the chip, and the one or more ceramic strips are arranged on each remaining surface of the ceramic body; and each ceramic strip is provided with a bonding finger pattern for bonding the chip, and the bonding finger pattern is connected to the shared solder pad through one or more metallized through-holes inside the ceramic body.

Combining the first aspect, in one possible implementation, ceramic strips are arranged around an inner periphery of each sealing ring to form a ceramic ring; or two ceramic strips are arranged on a pair of opposite surfaces of each sealing ring.

In a second aspect, embodiments of the present application provide a preparation method for a multi-surface airtight packaging ceramic shell as described above, the preparation method includes:

making a multi-surface raw porcelain body, forming metallized through-holes on the multi-surface raw porcelain body, and printing a preset metallized pattern on each surface of the multi-surface raw porcelain body;

making raw porcelain strips, forming metallized through-holes on the raw porcelain strips, and printing a preset bonding finger pattern on each raw porcelain strip; and performing following:

according to a first preset requirement, co-firing the raw porcelain strips and remaining surfaces of the multi-surface raw porcelain body other than the at least one surface having the shared solder pad, into one body, and plating nickel on the one body to form a nickel-plated part; and according to a second preset requirement, welding sealing rings on the remaining surfaces of the nickel-plated part other than the at least one surface having the shared solder pad, to obtain the multi-surface airtight packaging ceramic shell; or performing following:

sintering and plating nickel, after printing the preset metallized pattern on the each surface of the multi-surface raw porcelain body, on the multi-surface raw porcelain body to form a ceramic body, and plating nickel, after printing the preset bonding finger pattern on the each raw porcelain strip, on the raw porcelain strips to form ceramic strips; and according to a third preset requirement, welding the ceramic body, the ceramic strips and the sealing rings into one body to obtain the multi-surface airtight packaging ceramic shell.

Combining the second aspect, in one possible implementation, welding the sealing rings on the remaining surfaces of the nickel-plated part includes: plating gold on the nickel-plated part and the sealing rings, and assembling the nickel-plated part and the sealing rings by gold-tin welding.

Combining the second aspect, in one possible implementation, welding the sealing rings on the remaining surfaces of the nickel-plated part includes: assembling the nickel-plated part and the sealing rings by brazing, and plating gold on the nickel-plated part and the sealing rings.

Combining the second aspect, in one possible implementation, sintering and plating nickel on the multi-surface raw porcelain body to form the ceramic body includes: sintering the multi-surface raw porcelain body once to obtain a mature porcelain body; and printing the preset metallized pattern on each surface of the mature porcelain body, sintering the mature porcelain body, and plating nickel on the sintered mature porcelain body to obtain the ceramic body.

Combining the second aspect, in one possible implementation, welding the ceramic body, the ceramic strips and the sealing rings into the one body includes: placing a silver-copper solder paste on the preset metallized pattern of each remaining surface of the ceramic body, placing the ceramic strips on silver-copper solder pastes according to an assembly requirement, welding the ceramic strips, and performing a gold plating on the ceramic strips and the ceramic body.

Combining the second aspect, in one possible implementation, welding the ceramic body, the ceramic strips and the sealing rings into the one body includes: placing a silver-copper solder ring on the preset metallized pattern of each remaining surface of the ceramic body, placing the sealing rings on silver-copper solder rings according to an assembly requirement, welding the sealing rings, and performing a gold plating on the sealing rings and the ceramic body.

In a third aspect, embodiments of the present application provide a multi-surface packaging device, including a multi-surface airtight packaging ceramic shell as described above, where a shape of the ceramic body is a hexahedron, one surface of the ceramic body is provided with a shared solder pad configured to connect a PCB board, and remaining surfaces other than the surface having the shared solder pad are provided with sealing rings and chips.

It is apparent to those of ordinary skill in the art that the general description above and the detailed description in the following text are only illustrative and explanatory, and cannot limit this specification.

Advantageous Effects of the Disclosure

The multi-surface airtight packaging ceramic shell, the multi-surface packaging device, and the preparation method provided in the present application have the following beneficial effects compared to prior art: the ceramic body is a polyhedron, with one surface with a shared solder pad as the bottom surface, and the other surfaces have chip mounting areas, bonding areas, and sealing rings; when packaging, the bottom surface can be ball implanted or directly soldered to the PCB board, and the side surfaces can realize the installation, bonding, and sealing of multiple chips, achieving three-dimensional interconnection and multi-surface integration. Each side surface can encapsulate chips and directly achieve airtightness, greatly increasing the packaging area and reducing the module volume.

This type of ceramic shell can be applied to package gyroscopes and accelerometers, meeting the three-dimensional integration of multiple types of signal chips in the same package. It can maximize performance while reducing device size, providing strong packaging technology support for the upgrading and development of inertial measurement units and multi signal packaging units in improving integration, lightweight, and miniaturization.

BRIEF DESCRIPTION OF THE DRAWINGS

In order to provide a clearer explanation of the technical solution in the embodiments of the present application, a brief introduction will be given below to the accompanying drawings required in the embodiments or prior art descriptions. It is evident that the accompanying drawings in the following description are only some embodiments of the present application. For those skilled in the art, other accompanying drawings can be obtained based on these drawings without the need for creative labor.

NUMERAL ON THE ACCOMPANYING DRAWINGS

Figure 1:
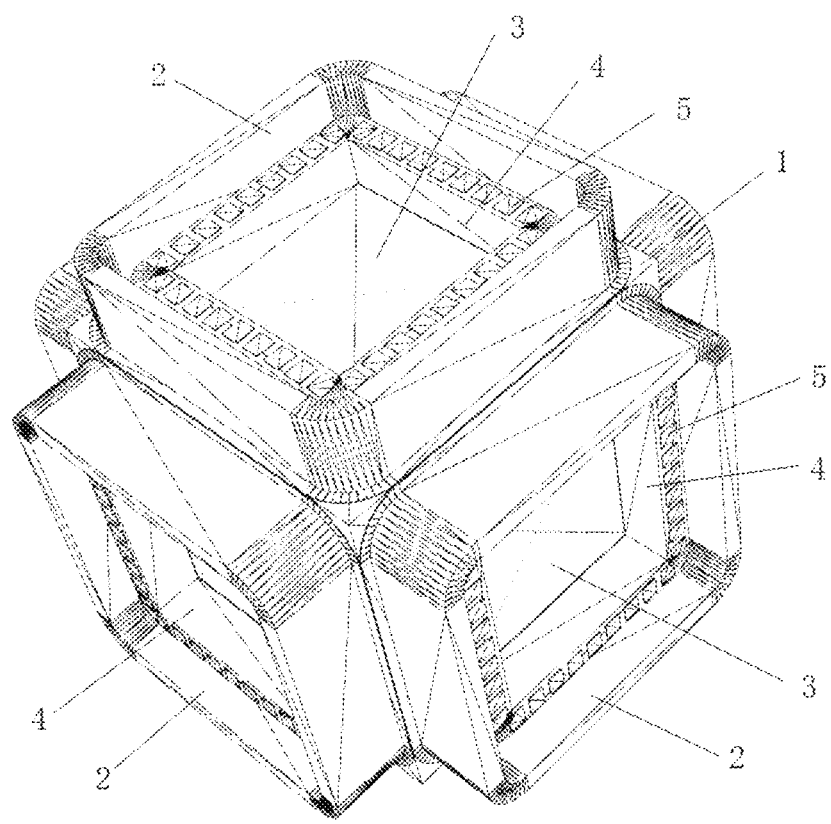
FIG. 1 is a schematic diagram of the three-dimensional structure of a multi-surface airtight packaging ceramic shell provided in an embodiment of the present application.

1—ceramic body, 2—sealing ring, 3—chip mounting area, 4—ceramic ring, 5—bonding finger pattern, 6—shared solder pad, 7—ceramic strip.

DETAILED DESCRIPTION OF ILLUSTRATIVE EMBODIMENTS

In order to make the technical problem, technical solution, and beneficial effects to be solved by the present application clearer and more understandable, the following will provide further detailed explanations of the present application in conjunction with the accompanying drawings and embodiments. It should be understood that the specific embodiments described herein are only used to explain the present application and are not intended to limit the present application.

Please refer to FIGS. 1 to 4 together, and now explain a multi-surface airtight packaging ceramic shell provided in the present application. The multi-surface airtight packaging ceramic shell includes a ceramic body 1, a shape of which is a polyhedron; where at least one surface of the ceramic body 1 is provided with a shared solder pad 6, remaining surfaces other than the at least one surface having the shared solder pad 6 are provided with sealing rings 2, and a packaging cavity for packaging a chip is formed inside each sealing ring 2.

Setting sealing rings 2 can form packaging cavities for packaging chips, achieving airtight packaging on remaining surfaces. If the cavity is directly processed on the side of the ceramic body 1, the processing difficulty is high, the cavity is prone to deformation, and the internal flatness of the cavity is poor, which affects the subsequent chip packaging. The structure of the sealing ring 2 can effectively solve the above problems. The sealing ring 2 is welded to the ceramic body 1 through solder, and the machining accuracy of the metal parts is higher, so the overall structural dimension accuracy is better controlled.

This structure ensures airtightness on remaining surfaces without the need for secondary packaging, reducing packaging complexity and overall system size, while also reducing device weight and production costs.

The multi-surface airtight packaging ceramic shell provided in the present application has the following beneficial effects compared to prior art: the ceramic body 1 is a polyhedron, with one surface with a shared solder pad 6 as the bottom surface, and the other surfaces have chip mounting areas 3, bonding areas, and sealing rings 2; when packaging, the bottom surface can be ball implanted or directly soldered to the PCB board, and the side surfaces can realize the installation, bonding, and sealing of multiple chips, achieving three-dimensional interconnection and multi-surface integration. Each side surface can encapsulate chips and directly achieve airtightness, greatly increasing the packaging area and reducing the module volume. This type of ceramic shell can be applied to package gyroscopes and accelerometers, meeting the three-dimensional integration of multiple types of signal chips in the same package. It can maximize performance while reducing device size, providing strong packaging technology support for the upgrading and development of inertial measurement units and multi signal packaging units in improving integration, lightweight, and miniaturization.

The bottom surface, as a shared solder pad 6 for all surfaces, can be a CLGA pad (a circular CLGA ceramic pad array) or a square pad. When applied, ball placement or surface mount welding can be used for easy soldering to the PCB board.

The polyhedron referred to in the present application refers to a solid enclosed by four or more polygons. A polyhedron has at least four surfaces, which are called tetrahedra, pentahedra, hexahedrons, and so on, depending on the number of surfaces. The present application prefers a cube with six surfaces, which can be extended to regular octahedra, regular dodecahedron, etc.

Figure 3:
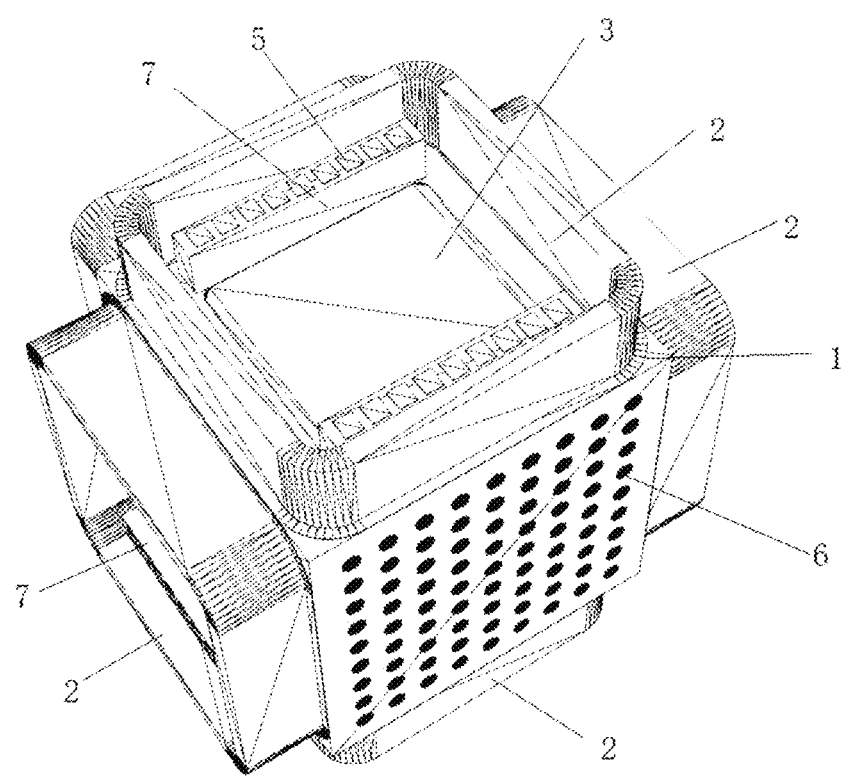
FIG. 3 is a schematic diagram of the three-dimensional structure of a multi-surface airtight packaging ceramic shell provided in an embodiment of the present application.
Figure 4:
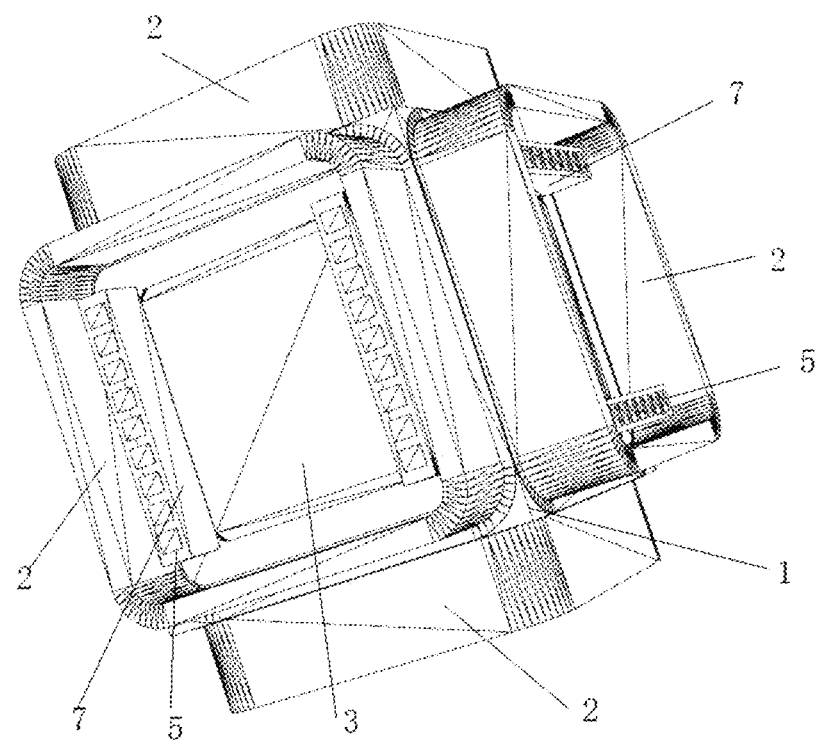
FIG. 4 is a schematic diagram of the three-dimensional structure of a multi-surface airtight packaging ceramic shell shown in FIG. 3 with different visual views.

In some embodiments, as shown in FIGS. 3 and 4, within each sealing ring 2 is provided with one or more ceramic strips 7 for bonding the chip, and the one or more ceramic strips 7 are arranged on each remaining surface of the ceramic body 1; and each ceramic strip 7 is provided with a bonding finger pattern 5 for bonding the chip, and the bonding finger pattern 5 is connected to the shared solder pad 6 through one or more metallized through-holes inside the ceramic body 1. The extension height of the ceramic strip 7 away from the ceramic body 1 is smaller than the extension height of the sealing ring 2 away from the ceramic body 1. Ceramic body 1 has chip mounting areas 3 on all surfaces except for the bottom surface, and the bonding finger pattern 5 on the ceramic strip 7 is the bonding area, so that after bonding the chip, the signal can be connected to the PCB board through the bonding finger, the metalized through-holes, and the shared solder pad 6.

The signal wiring is mainly located inside the ceramic body 1, which is made by stacking and sintering multiple layers of raw porcelain tiles. The side metallized pattern of the ceramic body 1 needs to cover at least two layers of raw porcelain tiles and be interconnected with the metallized pattern on one layer of raw porcelain tiles. The metallized pattern on the raw porcelain tile is then connected to the shared solder pad 6 through the one or more metallized through-holes inside the ceramic body 1. The metallized pattern inside the ceramic body 1 can be in the form of straight lines, curves, polylines, etc.

In order to solve the bridging problem caused by the dispersion of solder due to the small spacing between the metalized patterns on the ceramic strip 7 during welding the ceramic body 1 and the ceramic strips 7, grooves can be laser punched between the metalized patterns on the ceramic strip 7 to block solder dispersion.

Figure 2:
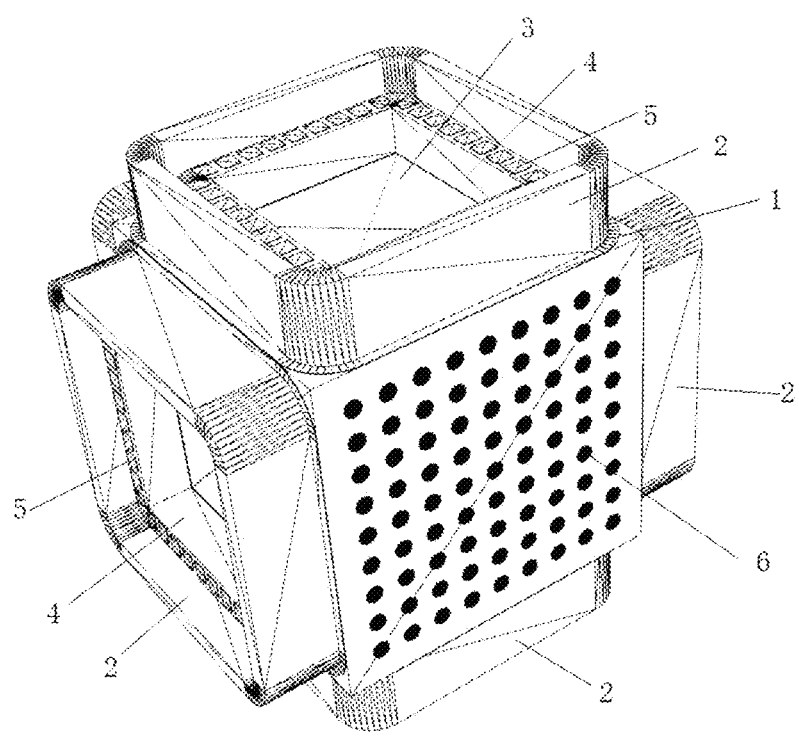
FIG. 2 is a schematic diagram of the three-dimensional structure of a multi-surface airtight packaging ceramic shell provided in an embodiment of FIG. 1 with different visual views.

In some embodiments, as shown in FIGS. 1 and 2, ceramic strips 7 are arranged around an inner periphery of each sealing ring 2 to form a ceramic ring 4; or two ceramic strips 7 are arranged on a pair of opposite surfaces of each sealing ring 2. Ceramic strips 7 can be arranged on each remaining surface of the ceramic body 1 for packaging chips. A pair of symmetrically arranged ceramic strips 7 can be used as bonding fingers, or a ceramic ring 4 surrounded by ceramic strips 7 can be used as bonding fingers. The ceramic strips 7 or ceramic ring 4 can also be of irregular structure to meet the needs of bonding chips.

Ceramic strips 7 need to be placed inside the sealing ring 2, and can be arranged arbitrarily inside the cavity formed by the sealing ring 2 according to the chip packaging requirements. However, they cannot be placed outside the sealing ring 2 or interfere with it, so as to ensure the airtightness after sealing.

In some embodiments, as shown in FIGS. 1 to 4, the corners of the sealing ring 2 are rounded corners. The rounded corner design can reduce surface defects of the product, appropriately disperse stress, improve the tensile, compressive, and bending strength of the product, reduce scratches and scrapes on other components, and increase the durability of the product.

In the above embodiments, the description of each embodiment has its own emphasis. For the parts that are not detailed or recorded in one embodiment, please refer to the relevant descriptions of other embodiments.

Figure 5:
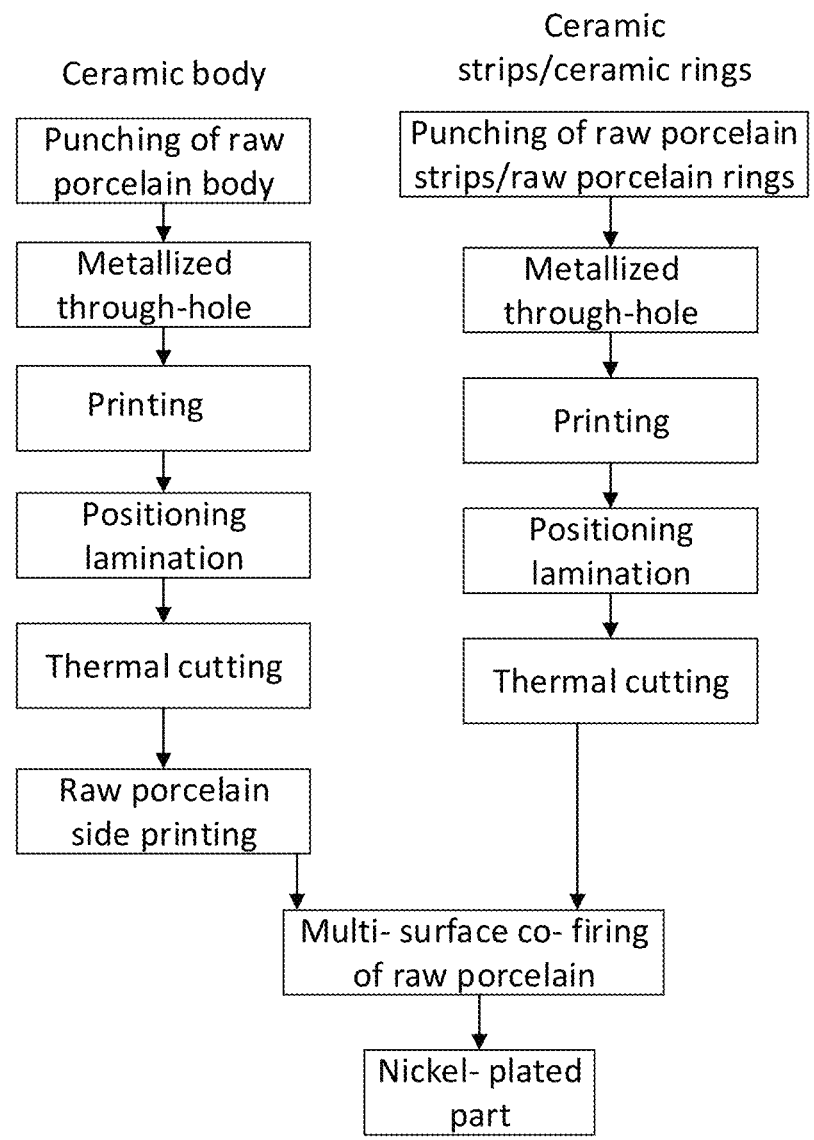
FIG. 5 is a process flowchart of a preparation method for a multi-surface airtight packaging ceramic shell provided in an embodiment of the present application.

Based on the same inventive concept, the present application also provides a preparation method for a multi-surface airtight packaging ceramic shell, which is used for the multi-surface airtight packaging ceramic shell. The method includes two processing routes, as shown in FIG. 5. The first processing route is as follows:

Step 1, making a multi-surface raw porcelain body, forming metallized through-holes on the multi-surface raw porcelain body, and printing a preset metallized pattern on each surface of the multi-surface raw porcelain body. Specifically, according to the preset packaging requirements on each surface, prepare metalized patterns of the same or different shapes. For example, print a shared solder pad 6 on the surface as the bottom surface, and on other surfaces, circular or strip-shaped metalized patterns can be made according to the bonding chip situation to meet the welding requirements of ceramic strips 7 or ceramic rings 4.

Step 2, making raw porcelain strips, forming metallized through-holes on the raw porcelain strips, and printing a preset bonding finger pattern 5 on each raw porcelain strip.

Step 3, according to a first preset requirement, co-firing the raw porcelain strips and remaining surfaces of the multi-surface raw porcelain body other than the at least one surface having the shared solder pad 6, into one body, and plating nickel on the one body to form a nickel-plated part.

Step 4, according to a second preset requirement, welding sealing rings 2 on the remaining surfaces of the nickel-plated part other than the at least one surface having the shared solder pad 6, to obtain the multi-surface airtight packaging ceramic shell.

It should be noted that for multi-layer ceramic shell, they are raw porcelain parts before sintering and mature porcelain parts after sintering. Therefore, in order to distinguish the products before and after sintering, they are called raw porcelains before sintering and ceramics after sintering.

Figure 6:
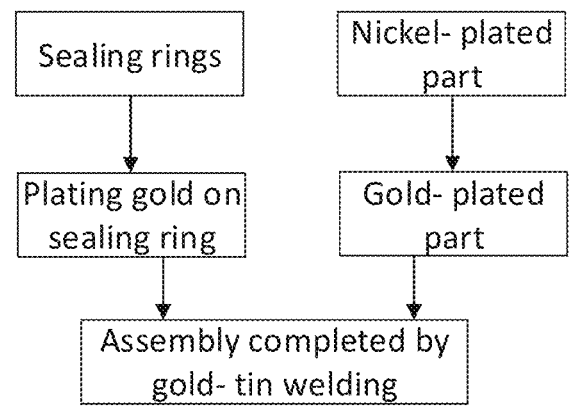
FIG. 6 is a process flowchart of a preparation method of a multi-surface airtight packaging ceramic shell provided in FIG. 5.

After the raw porcelain strips and each remaining surface of the raw porcelain body are co-fired into one body as described in this embodiment, the fourth step is to weld sealing rings on remaining surfaces of the nickel-plated part, which can be divided into two situations:

The first scenario includes: plating gold on the nickel-plated part and the sealing rings, the nickel-plated part becomes a gold-plated part after being gold-plated, and assembling the nickel-plated part and the sealing rings 2 by gold-tin welding. The complete process flowchart based on this embodiment is shown in FIG. 6.

Figure 7:
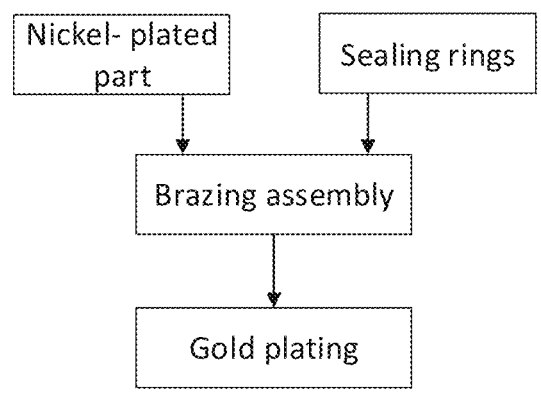
FIG. 7 is another process flowchart of a preparation method of a multi-surface airtight packaging ceramic shell provided in FIG. 5.

The second scenario includes: the nickel-plated part and the sealing ring 2 are first brazed and assembled, and then plating gold on the nickel-plated part and the sealing ring 2. The complete process flowchart based on this embodiment is shown in FIG. 7.

The present application adopts two implementation methods for the welding and co-firing of nickel-plated part and sealing ring 2. Firstly, the preparation of the three-dimensional multi-surface co-firing part of ceramic body 1 and ceramic strips 7 or ceramic rings 4 is completed in the sintering stage of the raw porcelain. Then, the first implementation method is that the three-dimensional multi-surface co-firing part, that is, the nickel-plated part, is first gold-plated separately with sealing rings 2 and then assembled by gold-tin welding. Alternatively, the second implementation method is that the nickel-plated part and sealing rings 2 are first assembled by brazing with silver-copper solder and then gold-plated.

Figure 8:
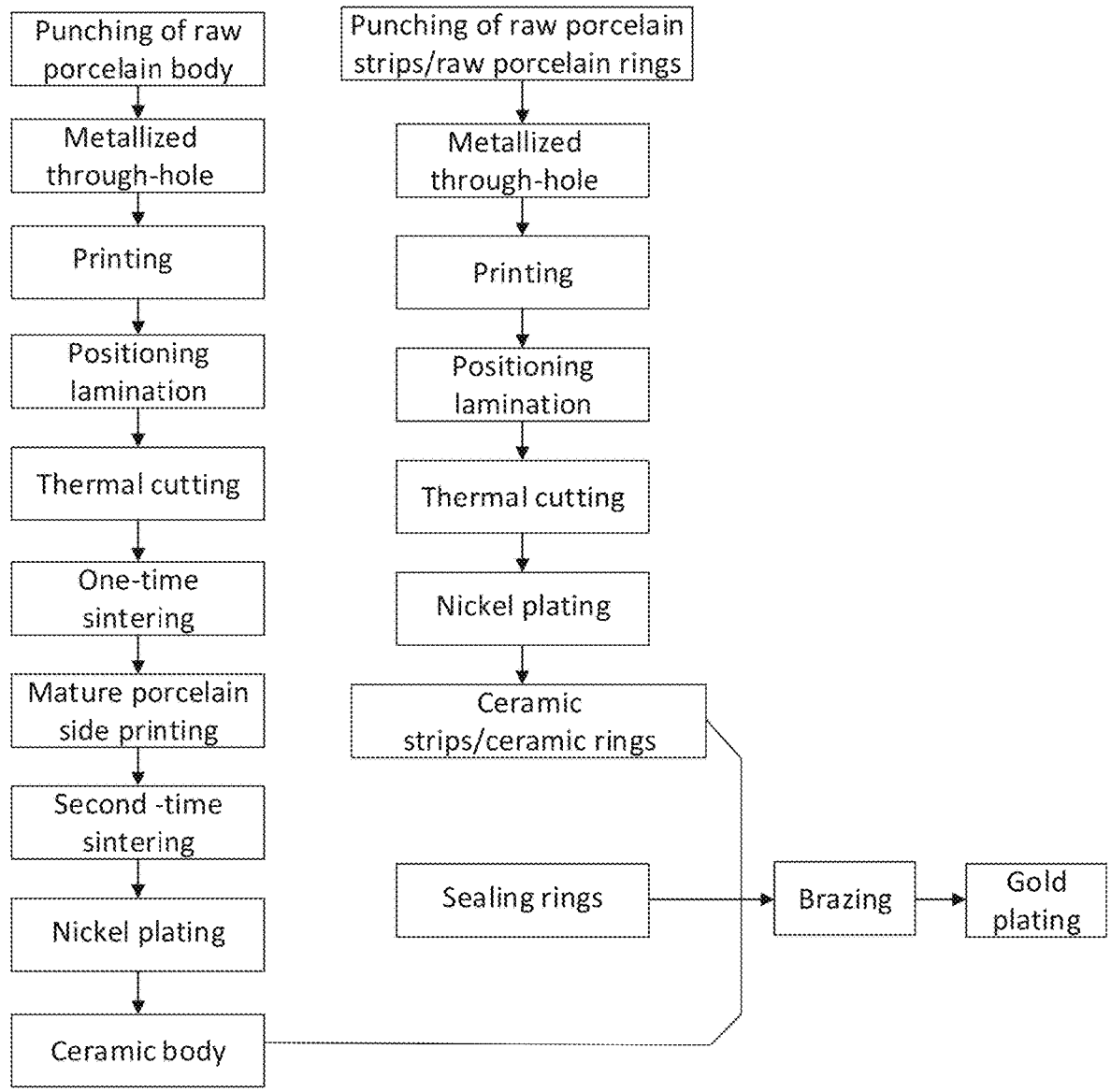
FIG. 8 is a process flowchart of a preparation method for a multi-surface airtight packaging ceramic shell provided in another embodiment of the present application.

As shown in FIG. 8, the second processing route of the present application is to separately produce ceramic body monomers, ceramic strip monomers, or ceramic ring monomers, and then weld ceramic body 1, ceramic strips 7 or ceramic rings 4, and sealing rings 2 into one body, and finally perform gold plating treatment, as follows: sintering and plating nickel, after printing the preset metallized pattern on the each surface of the multi-surface raw porcelain body, on the multi-surface raw porcelain body to form a ceramic body includes: sintering the multi-surface raw porcelain body once to obtain a mature porcelain body; and printing the preset metallized pattern on each surface of the mature porcelain body, sintering the mature porcelain body, and plating nickel on the sintered mature porcelain body to obtain the ceramic body. According to a third preset requirement, welding the ceramic body 1, the ceramic strips 7 and the sealing rings 2 into one body to obtain the multi-surface airtight packaging ceramic shell. The complete process flowchart based on this embodiment is shown in FIG. 8.

The ceramic body 1 of the present application adopts a secondary sintering process, which can improve the size and accuracy of the side printed graphics compared to the conventional ceramic shell sintered only once. The method of printing on the mature porcelain side of the shell after the first sintering is used to reduce the size shrinkage error caused by the sintering process. After printing, the secondary sintering is carried out, and the sintering temperature of the secondary sintering is lower than that of the first sintering. Its function is to increase the bonding strength between the metalized pattern printed on the side of the mature porcelain and the ceramic without causing secondary shrinkage or changing the size of the shell.

Welding the ceramic body 1 and the ceramic strips 7 includes: placing a silver-copper solder paste on the preset metallized pattern of each remaining surface of the ceramic body 1, placing the ceramic strips 7 on silver-copper solder pastes according to an assembly requirement, welding the ceramic strips 7, and performing a gold plating on the ceramic strips 7 and the ceramic body 1.

Welding the ceramic body 1 and the sealing rings 2 includes: placing a silver-copper solder ring on the preset metallized pattern of each remaining surface of the ceramic body 1, placing the sealing rings 2 on silver-copper solder rings according to an assembly requirement, welding the sealing rings 2, and performing a gold plating on the sealing rings 2 and the ceramic body 1.

The processing of ceramic strips 7 in the present application is carried out according to the conventional ceramic shell processing method. After nickel plating, the ceramic body 1, ceramic strips 7 or ceramic rings 4, and sealing rings 2 are silver-copper welded and then gold-plated to complete the preparation of the multi-surface airtight packaging ceramic shell. Among them, high-precision brazing of multi-surface three-dimensional structures is a difficult process. Conventional shell ceramic bodies and parts are welded using silver-copper solder pieces, which are mostly circular or elongated.

Due to the multi-surface three-dimensional brazing involved in the shell of the present application, surrounded by a sealing ring 2 on the outer side, and the interconnection relationship between the bonding finger pattern 5 on the ceramic strip 7 and the metallized pattern on the ceramic body 1, the welding width is narrow. Therefore, there are higher requirements for controlling the amount of brazing solder paste, welding accuracy, and welding strength. If conventional solder rings or solder pieces are used for welding ceramic strips 7 or ceramic rings 4 and ceramic body 1, after the solder melts, the ceramic between the solder pads does not wet the silver-copper solder, and the solder may have solidified before fully flowing to the solder pads, which can easily lead to bridging between the solder pads. At the same time, face by face welding requires multiple furnace entries, which will affect the solder fillet and weld size at the welding point, thereby affecting the welding strength between the ceramic strips 7 or ceramic rings 4 and the ceramic parts.

The present application uses a combination of silver-copper solder paste and silver-copper solder ring to achieve high-precision brazing of three-dimensional packaging. First, an appropriate amount of silver-copper solder paste is placed separately on the metalized pad or metalized pattern on the ceramic body 1, and then the ceramic strip 7 is placed on the silver-copper solder paste according to the assembly requirements. The sealing ring 2 is welded to the circular metalized pattern on the ceramic body 1 through the solder ring. Solder paste can accurately control the amount of solder and only solidify in the welding area, which can avoid the problems of bridging and low welding strength caused by solder sheet welding.

Based on the same inventive concept, as shown in FIGS. 1 to 4, the embodiments of the present application also provide a multi-surface packaging device, including the multi-surface airtight packaging ceramic shell, where the shape of the ceramic body 1 is a hexahedron, and one surface of the ceramic body 1 is provided with a solder pad for connecting the PCB board, that is, the shared solder pad 6, and the other five surfaces are respectively provided with chips and sealing rings 2. After bonding chips on the remaining five surface, weld a cover plate onto sealing ring 2.

The ceramic shell used in the present application is a hexahedron, with solder pads (CLGA solder pads or other square solder pads) on the bottom surface, and chip mounting area 3, bonding area, and sealing ring 2 on the other five surfaces. When packaging, bottom ball placement or direct soldering is used to solder to the PCB board, and the sides can achieve chip installation, bonding, and sealing on five surfaces.

The ceramic shell of this application overcomes the bottleneck of planar packaging of ceramic shells, from two-dimensional packaging to three-dimensional packaging, achieving three-dimensional interconnection, multi-surface integration, and can encapsulate chips on all five surfaces and directly achieve airtightness. The packaging area is more than 5 times that of traditional shells, and the module volume can be reduced by more than 50%. This type of casing can be applied to package gyroscopes and accelerometers, meeting the three-dimensional integration of multiple types of signal chips in the same package. It can maximize performance while reducing device size, providing strong packaging technology support for the upgrading and development of inertial measurement units and multi signal packaging units in improving integration, lightweight, and miniaturization.

The above description is only the preferred embodiment of the present application and is not intended to limit the present application. Any modifications, equivalent substitutions, and improvements made within the spirit and principles of the present application should be included within the scope of protection of the present application.

The invention claimed is:

1. A method of preparing a multi-surface airtight packaging ceramic shell, wherein the method comprises:
   making a multi-surface raw porcelain body with a polyhedron shape, forming metallized through-holes on the multi-surface raw porcelain body, and printing a preset metallized pattern on each surface of the multi-surface raw porcelain body to form a solder pad on at least one surface of the multi-surface raw porcelain body;
   making raw porcelain strips, forming metallized through-holes on the raw porcelain strips, and printing a preset bonding finger pattern on each raw porcelain strip; and
   performing the following:
      co-firing the raw porcelain strips and remaining surfaces of the multi-surface raw porcelain body other than the at least one surface having the solder pad, into one body, and plating nickel on the one body to form a nickel-plated part; and
      welding sealing rings on the remaining surfaces of the co-fired one body other than the at least one surface having the solder pad, to obtain the multi-surface airtight packaging ceramic shell and form a packaging cavity configured for packaging a chip inside each sealing ring.

2. The method according to claim 1, wherein welding the sealing rings on the remaining surfaces of the nickel-plated part comprises:
   plating gold on the nickel-plated part and the sealing rings, and assembling the nickel-plated part and the sealing rings by gold-tin welding.

3. The method according to claim 1, wherein welding the sealing rings on the remaining surfaces of the nickel-plated part comprises:
   assembling the nickel-plated part and the sealing rings by brazing, and plating gold on the nickel-plated part and the sealing rings.

4. A method of preparing a multi-surface airtight packaging ceramic shell, wherein the method comprises:
   making a multi-surface raw porcelain body with a polyhedron shape, forming metallized through-holes on the multi-surface raw porcelain body, and printing a preset metallized pattern on each surface of the multi-surface raw porcelain body to form a solder pad on at least one surface of the multi-surface raw porcelain body;
   making raw porcelain strips, forming metallized through-holes on the raw porcelain strips, and printing a preset bonding finger pattern on each raw porcelain strip; and
   performing the following:
      co-firing the raw porcelain strips and remaining surfaces of the multi-surface raw porcelain body other than the at least one surface having the solder pad, into one body, and plating nickel on the one body to form a nickel-plated part; and
      welding sealing rings on the remaining surfaces of the co-fired one body other than the at least one surface having the solder pad, to obtain the multi-surface airtight packaging ceramic shell and form a packaging cavity configured for packaging a chip inside each sealing ring, with one or more of the co-fired porcelain strips configured for bonding the chip being inside each sealing ring and being arranged on each of the remaining surfaces of the co-fired one body, and each preset bonding finger pattern configured for bonding the chip being connected to the solder pad through one or more of the metallized through-holes on the co-fired multi-surface porcelain body.

5. The method according to claim 4, wherein welding the sealing rings on the remaining surfaces of the nickel-plated part comprises:
   plating gold on the nickel-plated part and the sealing rings, and assembling the nickel-plated part and the sealing rings by gold-tin welding.

6. The method according to claim 4, wherein welding the sealing rings on the remaining surfaces of the nickel-plated part comprises:
   assembling the nickel-plated part and the sealing rings by brazing, and plating gold on the nickel-plated part and the sealing rings.

7. A method of preparing a multi-surface airtight packaging ceramic shell, wherein the method comprises:
   making a multi-surface raw porcelain body with a polyhedron shape, forming metallized through-holes on the multi-surface raw porcelain body, and printing a preset metallized pattern on each surface of the multi-surface raw porcelain body to form a solder pad on at least one surface of the multi-surface raw porcelain body;
   making raw porcelain strips, forming metallized through-holes on the raw porcelain strips, and printing a preset bonding finger pattern on each raw porcelain strip; and
   performing the following:
      co-firing the raw porcelain strips and remaining surfaces of the multi-surface raw porcelain body other than the at least one surface having the solder pad, into one body, and plating nickel on the one body to form a nickel-plated part; and
      welding sealing rings on the remaining surfaces of the co-fired one body other than the at least one surface having the solder pad, to obtain the multi-surface airtight packaging ceramic shell and form a packaging cavity configured for packaging a chip inside each sealing ring, with one or more of the co-fired porcelain strips configured for bonding the chip being inside each sealing ring and being arranged on each of the remaining surfaces of the co-fired one body, and each preset bonding finger pattern configured for bonding the chip being connected to the solder pad through one or more of the metallized through-holes on the co-fired multi-surface porcelain body; wherein the raw porcelain strips are arranged around an inner periphery of each sealing ring to form a ceramic ring.

8. The method according to claim 7, wherein welding the sealing rings on the remaining surfaces of the nickel-plated part comprises:

plating gold on the nickel-plated part and the sealing rings, and assembling the nickel-plated part and the sealing rings by gold-tin welding.

9. The method according to claim 7, wherein welding the sealing rings on the remaining surfaces of the nickel-plated part comprises:

assembling the nickel-plated part and the sealing rings by brazing, and plating gold on the nickel-plated part and the sealing rings.

* * * * *